(12) United States Patent
Utsumi

(10) Patent No.: US 10,267,298 B2
(45) Date of Patent: Apr. 23, 2019

(54) LINEAR MOTOR AND COMPONENT MOUNTING DEVICE

(71) Applicant: YAMAHA HATSUDOKI KABUSHIKI KAISHA, Shizuoka-ken (JP)

(72) Inventor: Tomoyoshi Utsumi, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 519 days.

(21) Appl. No.: 14/370,636

(22) PCT Filed: Dec. 17, 2012

(86) PCT No.: PCT/JP2012/008041
§ 371 (c)(1),
(2) Date: Jul. 3, 2014

(87) PCT Pub. No.: WO2013/105180
PCT Pub. Date: Jul. 18, 2013

(65) Prior Publication Data
US 2015/0004029 A1     Jan. 1, 2015

(30) Foreign Application Priority Data

Jan. 11, 2012    (JP) ................................ 2012-003191

(51) Int. Cl.
*H02K 41/03*      (2006.01)
*H02K 41/02*      (2006.01)
(Continued)

(52) U.S. Cl.
CPC ........... *F04B 17/03* (2013.01); *H02K 41/031* (2013.01); *H05K 13/0413* (2013.01); *H02K 5/225* (2013.01); *H02K 41/02* (2013.01)

(58) Field of Classification Search
CPC ....... H02K 41/02; H02K 41/03; H02K 41/031; H02K 5/225; H05K 13/0413
(Continued)

(56) References Cited

U.S. PATENT DOCUMENTS

2005/0077113 A1    4/2005   Deplazes et al.
2006/0232141 A1*   10/2006   Teramachi ............ F16C 29/063
                                                                                                      310/12.21
(Continued)

FOREIGN PATENT DOCUMENTS

CN           1965460 A     5/2007
EP           2242169 A1    10/2010
(Continued)

OTHER PUBLICATIONS

JP 03265458 A (English Translation).*
(Continued)

*Primary Examiner* — Thomas Truong
*Assistant Examiner* — Alexander Moraza
(74) *Attorney, Agent, or Firm* — Studebaker & Brackett PC

(57) ABSTRACT

A linear motor includes a stator having a core and an armature including coils respectively attached to the cores. A mover includes a shaft-like member having an opposed surface opposed to the armature and a field magneton made of a plurality of permanent magnets arrayed along the shaft-like member and fixed to the opposed surface. A frame member is configured to support the stator. A retaining member is attached to the frame member and configured to retain the shaft-like member movably in the longitudinal direction thereof such that the mover is movable in the first direction with respect to the stator.

6 Claims, 7 Drawing Sheets

(51) Int. Cl.
  *F04B 17/03* (2006.01)
  *H05K 13/04* (2006.01)
  *H02K 5/22* (2006.01)

(58) Field of Classification Search
  USPC .......... 310/12.01, 12.11, 12.24, 12.13, 12.19
  See application file for complete search history.

(56) References Cited

U.S. PATENT DOCUMENTS

| | | |
|---|---|---|
| 2007/0096567 A1 | 5/2007 | Miyamoto et al. |
| 2010/0289345 A1 | 11/2010 | Sakai et al. |
| 2010/0296906 A1 | 11/2010 | Hanamura et al. |
| 2011/0052348 A1* | 3/2011 | Hanamura ............. H02K 16/00 414/225.01 |
| 2014/0175910 A1 | 6/2014 | Hanamura et al. |

FOREIGN PATENT DOCUMENTS

| | | | |
|---|---|---|---|
| JP | 03265458 A | * | 11/1991 |
| JP | 2004-312983 A | | 11/2004 |
| JP | 2005-065430 A | | 3/2005 |
| JP | 2006-109664 A | | 4/2006 |
| JP | 2009-164398 A | | 7/2009 |
| JP | 2009-171681 A | | 7/2009 |

OTHER PUBLICATIONS

An Office Action issued by the Korean Patent Office dated Nov. 19, 2015, which corresponds to Korean Patent Application No. 10-2014-7021956 and is related to U.S. Appl. No. 14/370,636; with English language translation.

The First Office Action issued by the State Intellectual Property Office of People's Republic of China dated Feb. 3, 2016, which corresponds to Chinese Patent Application No. 201280066395.4 and is related to U.S. Appl. No. 14/370,636; with English language translation.

International Search Report; PCT/JP2012/008041; dated Mar. 12, 2013.

The extended European search report issued by the European Patent Office dated Jul. 16, 2015, which corresponds to European Patent Application No. 12865422.5-1905 and is related to U.S. Appl. No. 14/370,636.

* cited by examiner

LINEAR MOTOR AND COMPONENT MOUNTING DEVICE

CROSS REFERENCE TO RELATED APPLICATIONS

This application claims benefit of priority to Japanese Patent Application 2012-003191 filed on Jan. 11, 2012, and to International Patent Application No. PCT/JP2012/008041 filed on Dec. 17, 2012, the entire content of each of which is incorporated herein by reference.

TECHNICAL FIELD

The present technical field relates to a linear motor and a component mounting device or the like, a component retaining member of which is driven by the linear motor.

BACKGROUND

Conventionally, there has been known a linear motor including a field magneton and an armature arranged to be opposed to the field magneton. One of the field magneton and the armature being provided as a stator and the other being provided as a mover and the linear motor moving the mover relatively to the stator. Specifically, the field magneton has a configuration in which a plurality of different permanent magnets, magnetic poles of which on the armature side are alternately different, arrayed in a row. The armature has a configuration in which a coil is wound around a core. That is, the coil is subjected to energization control, whereby the linear motor relatively moves the armature and the mover linearly in an arraying direction of the permanent magnets.

For example, Japanese Patent Application Laid-open No. 2004-312983 discloses a linear motor including a track rail to which the field magneton (the permanent magnets) is fixed and a movable body movably supported by the track rail and mounted with the armature. The track rail is formed in a U-shape in cross section including a bottom wall and a pair of sidewalls projecting from both sides in the width direction of the bottom wall. The field magneton (the permanent magnets) is fixed to the bottom wall. The movable body includes a pair of sliders arranged in the longitudinal direction of the track rail and a connecting top plate that connects the sliders. The sliders are arranged between both the sidewalls of the track rail and are respectively movably supported by both the sidewalls. The armature is interposed between both the sliders to be opposed to the field magneton and is fixed to the combining top plate.

The linear motor is applied to various industrial machines and is also applied to a component mounting device that conveys an electronic component onto a board and mounts the electronic component on the board. For example, Japanese Patent Application Laid-open No. 2009-171681 describes a component mounting device that drives, using a linear motor, a nozzle for component attraction to ascend and descend. In the linear motor applied to the component mounting device, an armature and a linear guide (a guide device) are provided to be laterally arranged on the same surface of a frame member. A slide base is fixed to sliders of the linear guide. A field magneton (permanent magnets) is fixed on a side surface of the slide base. That is, the component mounting device moves the slide base (up and down) according to the driving by the linear motor to move the nozzle connected to the slide base up and down.

The linear motor disclosed in Japanese Patent Application Laid-open No. 2004-312983 includes a structure in which the armature is arranged between the pair of sliders. Therefore, in the linear motor, when the total length of the armature increases, a moment acting on both the sliders increases because of a load of the armature. As a result, it is likely that smooth movement of the movable body is hindered. In the linear motor, since the movable body is interposed between the pair of sidewalls of the track rail, an extra dimension is necessary in the width direction (a direction orthogonal to both of a direction in which the armature and the field magneton are opposed to each other and a moving direction of the movable body) by the thickness of the sidewalls. This is disadvantageous in making the entire linear motor compact in the width direction.

On the other hand, with the linear motor disclosed in Japanese Patent Application Laid-open No. 2009-171681, since the stator includes the armature as explained above, unlike the linear motor disclosed in Japanese Patent Application Laid-open No. 2004-312983, it is unlikely that smooth movement of the movable body (the slide base) is hindered by expansion of the entire length of the armature. Moreover, in the linear motor disclosed in Japanese Patent Application Laid-open No. 2009-171681, the armature and the linear guide are provided to be laterally arranged on the same surface of the frame member and then the slide base is fixed to the sliders of the linear guide and the field magneton (the permanent magnets) is fixed to the side surface of the slide base. Compared with the linear motor disclosed in Japanese Patent Application Laid-open No. 2004-312983, this is advantageous in making the entire linear motor compact in the width direction (a direction orthogonal to both of a direction in which the armature and the field magneton are opposed to each other and a moving direction of the slide base). However, in the linear motor disclosed in Japanese Patent Application Laid-open No. 2009-171681, since the armature and the linear guide are provided to be laterally arranged on the same surface of the frame member, an occupied space in the lateral arrangement direction is relatively large. It is difficult to make the entire linear motor compact in the lateral arrangement direction, that is, the direction in which the armature and the field magneton are opposed to each other. Therefore, improvement is demanded in this regard. Note that, in this case, if it is possible to reduce the number of components included in the linear motor, the reduction in the number of components is convenient from the viewpoint of a reduction in manufacturing costs and improvement of assemblability.

SUMMARY

The present disclosure has been devised in view of the above circumstances and it is an object of the present disclosure to provide a linear motor that can further contribute to a demand for compactness while smoothly moving a mover and a component mounting device mounted with the linear motor.

A linear motor according to an aspect of the present disclosure includes: a stator including an armature, the armature including a core and coils, the core including a plurality of teeth arranged in a first direction, the coils being attached respectively to the teeth of the core; a mover including a shaft-like member extending in the first direction and having an opposed surface opposed to the armature and a field magneton made of a plurality of permanent magnets arrayed along the shaft-like member such that magnetic poles of the magnets on the armature side are alternately different, the plurality of permanent magnets being fixed to the opposed surface; a frame member configured to support the stator; and a retaining member attached to the frame member and configured to retain the shaft-like member movably in the longitudinal direction thereof such that the mover is movable in the first direction with respect to the stator.

A component mounting device according to an aspect of the present disclosure includes: a component supplying section; a component retaining member configured to take out a component supplied by the component supplying section and mount the component on a board; and the linear motor explained above for driving the component retaining member to ascend and descend. The component retaining member is connected to the shaft-like member of the mover of the linear motor.

DETAILED DESCRIPTION

A preferred embodiment of the present disclosure is explained in detail below with reference to the accompanying drawings.

Figure 1:
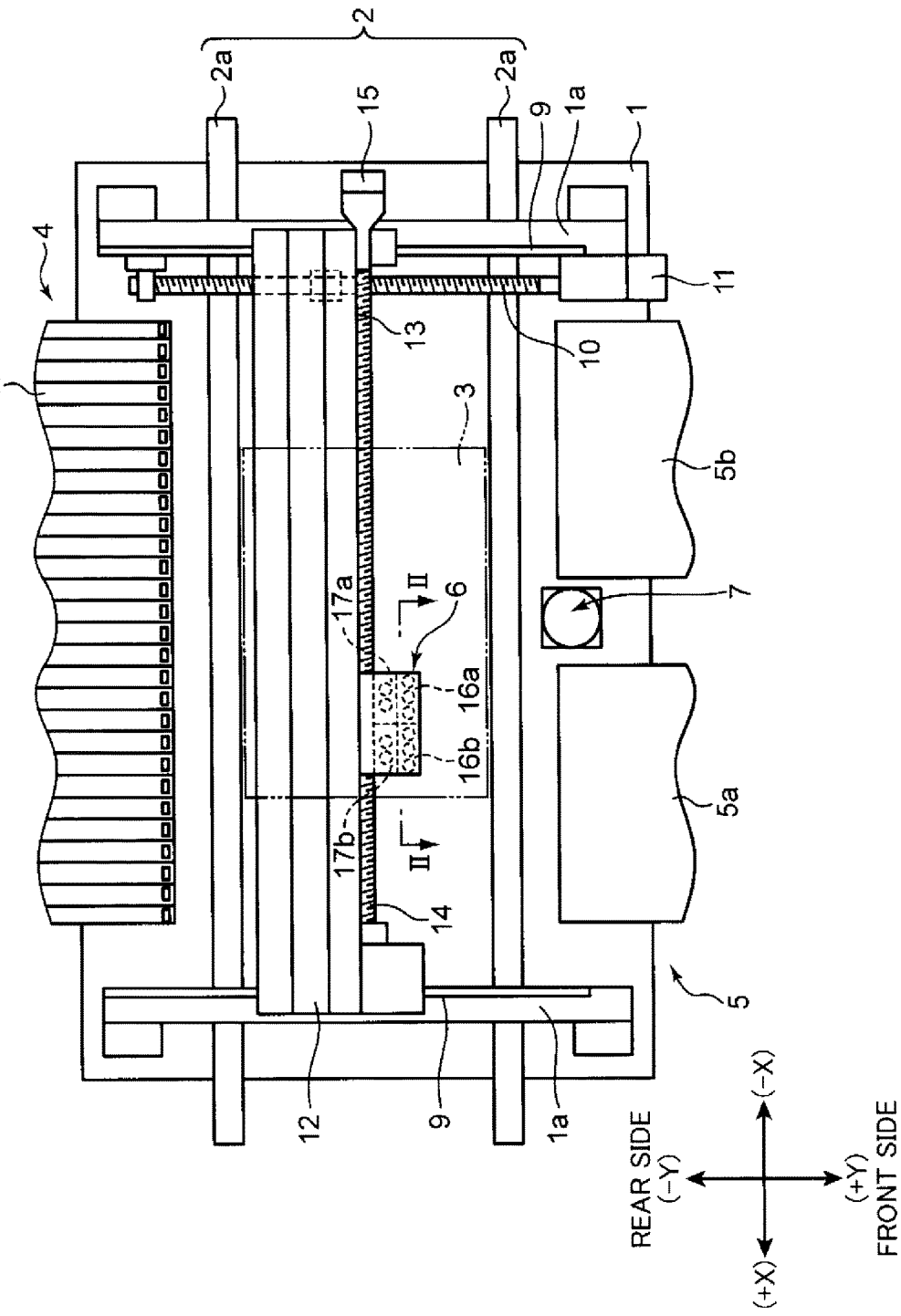
FIG. 1 is a plan view showing a component mounting device according to the present disclosure.

FIG. 1 schematically shows, as a plan view, a component mounting device according to the present disclosure (a component mounting device applied with a linear motor according to the present disclosure). Note that, in FIG. 1 and figures explained below, XYZ rectangular coordinate axis are shown in order to clarify a directional relation among the figures.

The component mounting device includes a base 1, a board conveying mechanism 2 arranged on the base 1 and configured to convey a board 3 such as a printed wiring board (PWB) in an X direction, component supplying sections 4 and 5, a head unit 6 for component mounting, a head unit driving mechanism configured to drive the head unit 6, and an imaging unit 7 for component recognition.

The board conveying mechanism 2 includes a pair of conveyors 2a configured to convey the board 3 on the base 1. The conveyors 2a receive the board 3 from the right side in the figure, convey the board 3 to a predetermined mounting work position (a position shown in the figure), and retain the board 3 with a not-shown retaining device. After the mounting work, the conveyors 2a release the retention of the board 3 and convey the board 3 out to the left side in the figure.

The component supplying sections 4 and 5 are arranged on both sides (both sides in a Y direction) of the board conveying mechanism 2. In the component supplying section 4 on one side of the component supplying sections 4 and 5, a plurality of tape feeders 4a arranged in the X direction along the board conveying mechanism 2 are arranged. The tape feeders 4a include reels wound with a tape in which a small piece-like chip component such as an IC, a transistor, and a capacitor is housed and retained. The tape feeders 4a supply a component to a predetermined component supply position near the board conveying mechanism 2 while intermittently letting out the tape from the reels. On the other hand, in the component supplying section 5 on the other side, trays 5a and 5b are set a predetermined space apart from each other in the X direction. In each of the trays 5a and 5b, package-type components such as a quad flat package (QFP) and a ball grid array (BGA) are aligned and placed such that the components can be taken out by the head unit 6 explained below.

The head unit 6 takes out a component from the component supplying sections 4 and 5 and mounts the component on the board 3. The head unit 6 is arranged above the board conveying mechanism 2, the component supplying sections 4 and 5, and the like.

The head unit 6 is enabled to move in the X direction and the Y direction in a fixed region by the head unit driving mechanism. The head unit driving mechanism includes a pair of fixed rails 9 respectively fixed to a pair of elevated frames 1a, which are provided on the base 1, and extending in parallel to each other in the Y direction, a unit supporting member 12 supported by the fixed rails 9 and extending in the X direction, and a ball screw shaft 10 screwed and inserted into the unit supporting member 12 and driven by a Y-axis servomotor 11. The head unit driving mechanism includes a fixed rail 13 fixed to the unit supporting member 12 and configured to support the head unit 6 to be movable in the X direction and a ball screw shaft 14 screwed and inserted into the head unit 6 and driven by using an X-axis servomotor 15 as a driving source. That is, the head unit driving mechanism moves the head unit 6 in the X direction via the ball screw shaft 14 according to the driving by the X-axis servomotor 15 and moves the unit supporting member 12 in the Y direction via the ball screw shaft 10 according to the driving by the Y-axis servomotor 11. As a result, the head unit driving mechanism moves the head unit 6 in the X direction and the Y direction in the fixed region.

Figure 2:
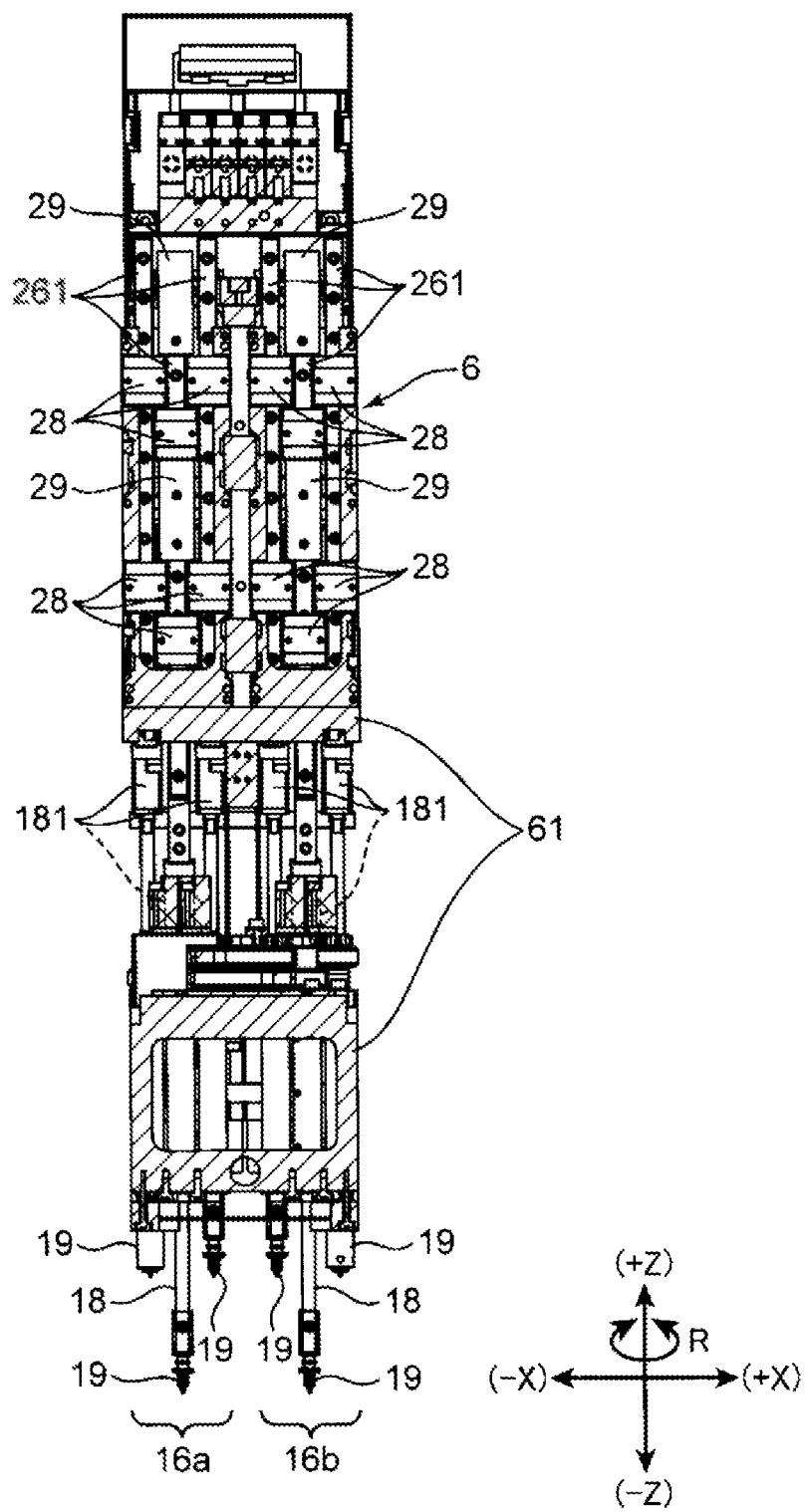
FIG. 2 is a sectional view (taken along sectional line II-II of FIG. 1) showing a head unit.
Figure 3:
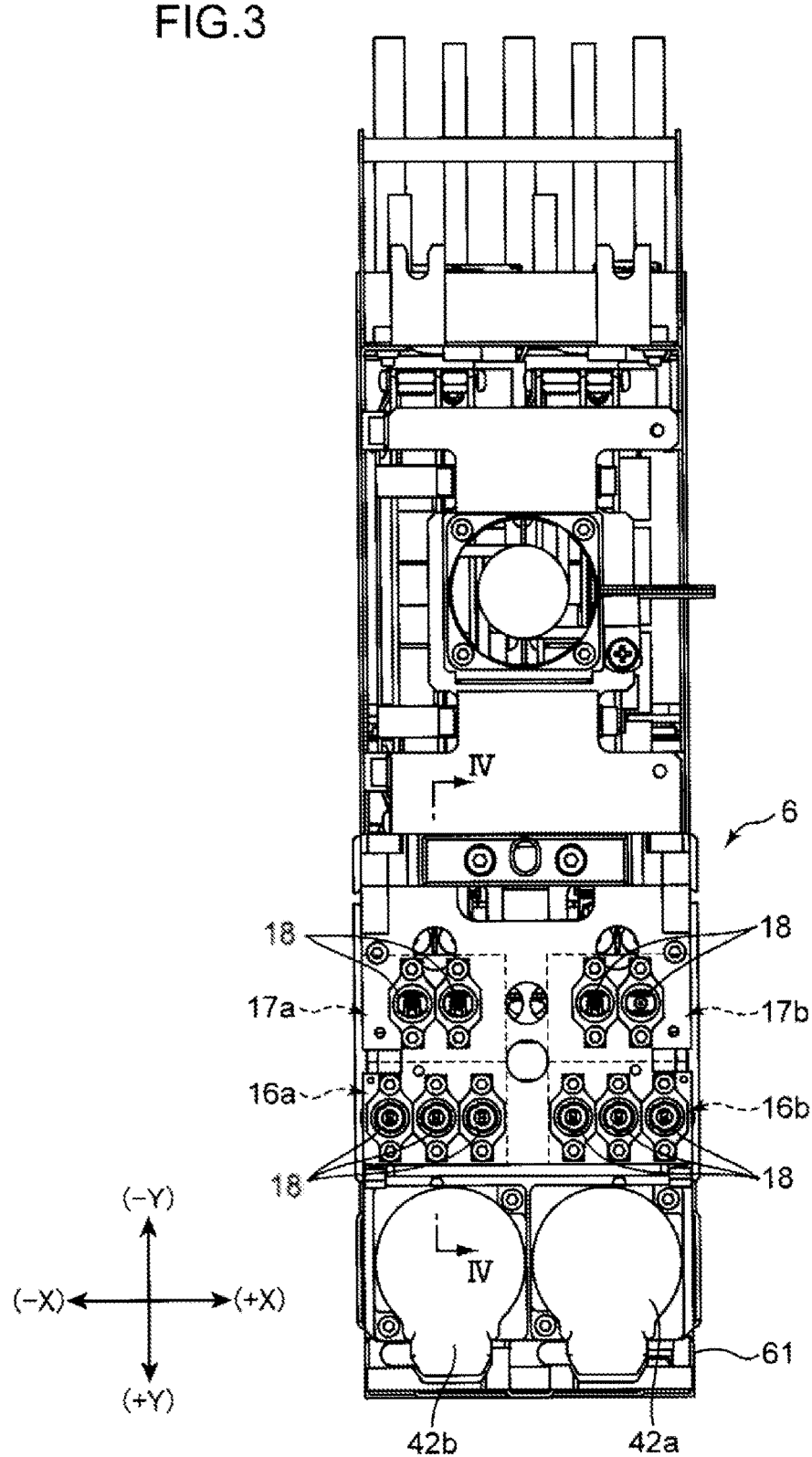
FIG. 3 is a bottom view showing an upper surface portion of the head unit.

The head unit 6 includes, as shown in FIG. 2 and FIG. 3, two front row heads 16a and 16b arranged along the X direction and two rear row heads 17a and 17b arranged along the X direction in the same manner in the back of the front row heads 16a and 16b. As explained below in detail, both of the front row heads 16a and 16b and the rear row heads 17a and 17b are units including multi-axis linear motors. Each of the front row heads 16a and 16b includes three driving shafts 18 arranged in a row in the X direction and extending in a Z direction. Each of the rear row heads 17a and 17b includes two driving shafts 18 arranged in a row in the X direction and extending in the Z direction. Consequently, in the head unit 6, ten driving shafts 18 in total are provided in a state in which the driving shafts 18 are divided into front and rear two rows, specifically, in a state in which the driving shafts 18 are divided into six driving shafts in the front row and four driving shafts in the rear row. Note that the driving shafts 18 of the front row heads 16a and 16b and the driving shafts 18 of the rear row heads 17a and 17b are offset from each other in the X direction. Consequently, ten nozzles 19 (driving shafts 18) are arranged in zigzag as a whole.

The driving shafts 18 include nozzles 19 for component attraction at the distal ends (the lower ends) thereof. The nozzles 19 are enabled to communicate with any one of a negative pressure generating device, a positive pressure generating device, and the atmosphere respectively via electric switching valves. Consequently, when a negative pressure is supplied to the distal ends of the nozzles 19, the nozzles 19 can attract and retain a component. Thereafter, when a positive pressure is supplied to the distal ends of the nozzles 19, the nozzles 19 release the attracted state of the component. In this example, the driving shafts 18 and the nozzles 19 are equivalent to the component retaining member of the present disclosure.

The nozzles 19 (the driving shafts 18) are enabled to ascend and descend (move in the Z direction) with respect to the head unit 6 and rotate about the center axis (in an R direction). The nozzles 19 (the driving shafts 18) are respectively driven by ascent and descent driving mechanisms and rotation driving mechanisms. Of these driving mechanisms, the ascent and descent driving mechanisms are respectively incorporated in the heads 16a to 17b. Note that the configuration of the heads 16a to 17b including the ascent and descent driving mechanisms and the configuration of the rotation driving mechanisms of the nozzles 19 are explained below.

In order to recognize a retaining state of a component by the nozzles 19 as images, prior to mounting, the imaging unit 7 images the component taken out from the component supplying sections 4 and 5. The imaging unit 7 is arranged in a position on the base 1 and between the trays 5a and 5b. The imaging unit 7 is fixedly arranged on the base 1 and includes a camera (an image sensor) configured to image the component, which is retained by the nozzles 19, from the lower side of the component and a lighting device configured to give illumination for imaging to the component. After the attraction of the component from the component supplying sections 4 and 5, when the head unit 6 moves above the imaging unit 7, the imaging unit 7 images the component retained by the nozzles 19 and outputs image data of the component to a not-shown control device.

The specific configuration of the head unit 6 and the heads 16a to 17b is explained.

Figure 4:
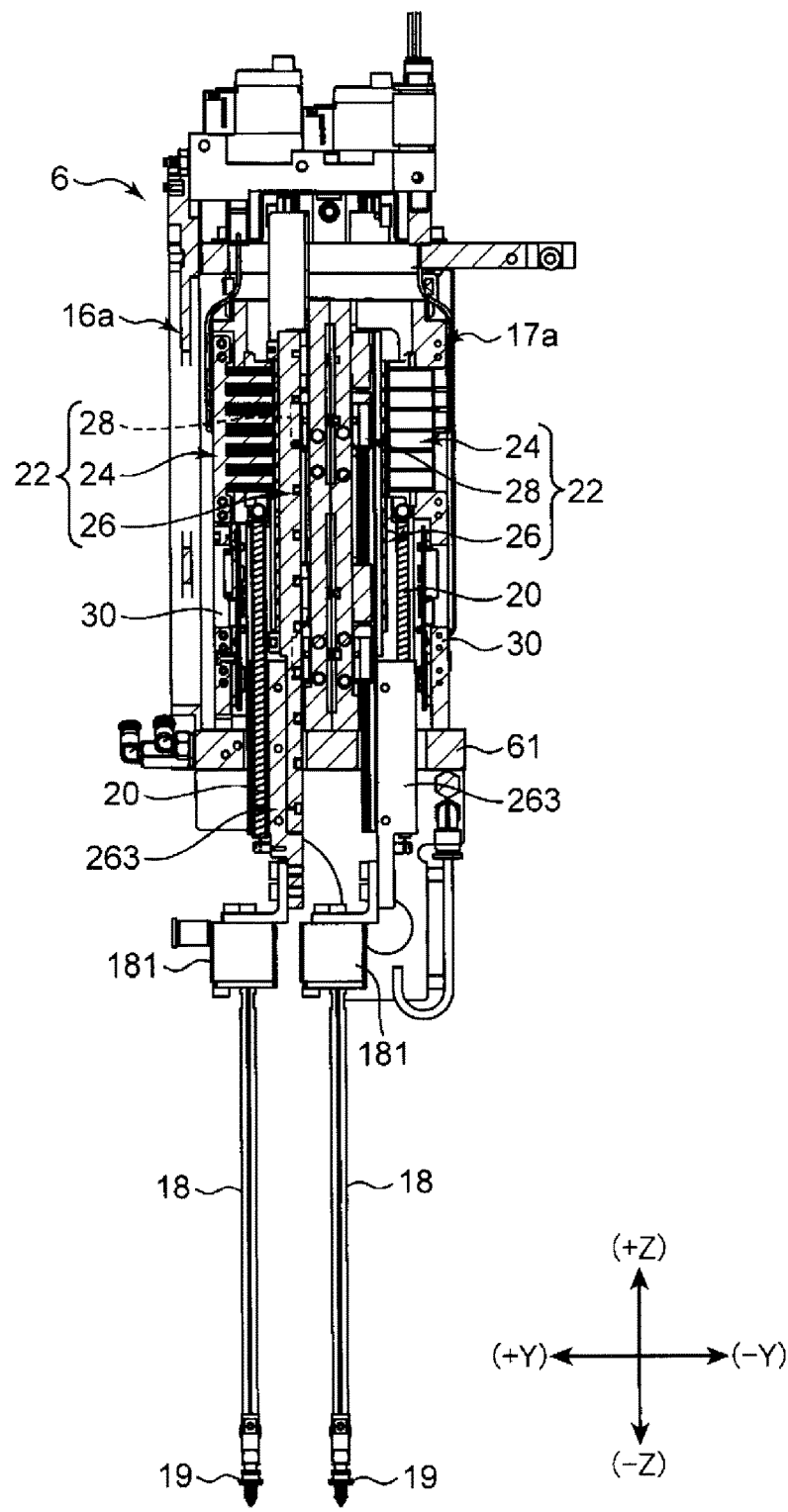
FIG. 4 is a longitudinal sectional view (taken along sectional line IV-IV of FIG. 3) showing the head unit.

The head unit 6 includes the four heads 16a to 17b in total, i.e., the front row heads 16a and 16b and the rear row heads 17a and 17b as explained above. As shown in FIG. 3 and FIG. 4, among the heads 16a to 17b, the heads 16a and 17a located on the right side (−X direction side) are adjacent to each other in the front back direction (the Y direction). Similarly, the heads 16b and 17b located on the left side are adjacent to each other in the front back direction. In this state, the heads 16a to 17b are fixed to a head frame 61 of the head unit 6.

The configuration of the heads 16a to 17b is explained below mainly with reference to FIG. 4 to FIG. 7 taking the front row head 16a as an example.

The front row head 16a schematically includes a multi-axis linear motor having a three-axis configuration, the three driving shafts 18 individually driven up and down by the multi-axis linear motor (hereinafter simply referred to as linear motor), the nozzles 19 attached to the lower end portions of the driving shafts 18, return springs 20, and linear encoders 32.

The linear motor is configured from a linear motor main body 22 and a frame member 30 in which the linear motor main body 22 is incorporated. The linear motor main body 22 includes a stator 24, a mover 26, and a retaining member 28 configured to movably retain the mover 26. The linear motor (the linear motor of the front row head 16a) in this example has a configuration in which three linear motor main bodies 22, three linear encoders 32 respectively corresponding to the linear motor main bodies 22, and three return springs 20 respectively corresponding to the linear motor main bodies 22 are incorporated in the common (one) frame member 30. The driving shafts 18 are respectively connected to the movers 26 of the linear motor main bodies 22. With this configuration, the nozzles 19 (the driving shafts 18) are configured to be respectively driven to ascend and descend in the Z direction by the linear motor main bodies 22 and, when the linear motor main bodies 22 are stopped, respectively retained in predetermined ascending end positions by urging forces of the return springs 20.

Specifically, the frame member 30 has a box-like shape pierced in the Z direction including an end block 310, a normal direction of which is the Y direction, a pair of side plates 312 arranged on both sides in the X direction of the end block 310, and a front block 314 configured to sandwich both the side plates 312 in the Y direction in cooperation with the end block 310. All of the blocks 310 and 314 and the plate 312 are formed of a nonmagnetic material such as an aluminum alloy.

The linear motor main bodies 22 include the stators 24, the movers 26, and the retaining members 28 as explained above. The stator 24 is an armature including a comb-like core 241 integrally including a yoke extending in the Z direction and a plurality of teeth projecting at a right angle from a side portion of the yoke to the rear side (a −Y direction side) and arranged in the Z direction (equivalent to the first direction of the present disclosure) and coils 242 attached to the teeth of the core 241. The stators 24 of the linear motor main bodies 22 are fixed to the front block 314 in a state in which the stators 24 are arranged in parallel in the X direction. That is, the frame member 30 supports the stators 24. Note that reference numeral 244 in FIG. 6 and FIG. 7 denote wires for respectively supplying an electric current for driving to the stators 24 (the coils 242).

On the other hand, the mover 26 is provided to be laterally arranged in the Y direction with respect to the stator 24. The mover 26 includes a shaft-like member 261 rectangular in cross section extending in the Z direction and having an opposed surface opposed to the stator 24, a plurality of permanent magnets 262 functioning as a field magneton fixed to the opposed surface of the shaft-like member 261, and an attachment block 263 to which the driving shaft 18 is attached.

The plurality of permanent magnets 262 are fixed along the Z direction in a fixed range from the upper end (a +Z direction side end) of the shaft-like member 261 such that polarities on the front surface side (i.e., the stator 24 side) are alternately different. The attachment block 263 is attached further on the lower side (a −Z direction side end) than a region where the permanent magnets 262 are fixed in the shaft-like member 261. The attachment block 263 is a structure integrally including a sleeve section 263a rectangular in cross section and a shaft attachment section 263b connected to the lower end portion of the sleeve section 263a. The upper end portion of the driving shaft 18 is fixed to the shaft attachment section 263b (see FIG. 4). A stud pin 264 projecting forward along the Y direction is erected on the upper end front surface of the shaft attachment section 263b. One end portion of the return spring 20 is attached to the stud pin 264. The return spring 20 passes through the inside of the sleeve section 263a and exposes the other end portion above the sleeve section 263a.

The movers 26 of the linear motor main bodies 22 are arranged in parallel in the X direction and each are arranged such that the field magneton (the permanent magnets 262) is opposed to the armature (the stator 24) in the Y direction, specifically, such that a predetermined gap is formed between the stator 24 and the mover 26 (more accurately, between a mover side end portion of the comb-like core 241 and stator side surfaces of the permanent magnets 262). The movers 26 are attached to a plurality of the retaining members 28 fixed to the end block 310 such that the movers 26 can slide in the longitudinal direction (the longitudinal direction of the shaft-like member 261; the Z direction). That is, the retaining members 28 are attached to a frame member in each of the linear motor main bodies 22 and support the movers 26 to be capable of independently moving in the up down direction. Note that, in FIG. 7, only the retaining members 28 that retain the movers 26 located on the most front side (−X direction side) are shown. The other retaining members 28 are omitted. The other end portion of the return spring 20 is attached to the front block 314 by a not-shown bolt. Consequently, when a predetermined driving current is applied to the stators 24 (the armatures) of the linear motor main bodies 22 from the not-shown control device, specifically, when three-phase currents having different phases are applied to the coils 242, magnetic fields are generated in the coils 242. A propulsive force for moving the movers 26 in the Z direction is generated between the stators 24 and the movers 26. The movers 26 (the driving shafts 18) move in the Z direction with respect to the frame member 30 with the propulsive force. When the current supply to the coils 242 is cut off, the shaft-like member 261 is urged upward along the Z axis by an elastic force of the return spring 20. As a result, the movers 26 (the driving shafts 18) of the linear motor main bodies 22 are retained in upper end positions of movable regions thereof.

The front row head 16a further includes, as schematically shown in FIG. 2 (not shown in FIG. 7), a blocking member 29 fixed to the frame member 30 (the end block 310). The blocking member 29 is a member for preventing mutual action between the adjacent linear motor main bodies 22, for example, an adverse effect such as interlocking of the movers 26. The blocking member 29 is a member having a square C-shape in cross section including blocking walls respectively interposed among the adjacent movers 26. The entire blocking member 29 is formed of a magnetic body.

Note that the shaft-like member 261 and the retaining member 28 are configured by a guide device called linear guide including a rail member and sliders movably attached to the rail member. That is, the shaft-like member 261 of the mover 26 is configured by the rail member of the guide device. The retaining member 28 is configured by the sliders. With this configuration, the linear motor main bodies 22 are configured to be capable of stably and smoothly moving the movers 26 (the driving shafts 18) in the Z direction. The shaft-like member 261 (the rail member) is formed of a magnetic material. Consequently, the linear motor includes a configuration in which the shaft-like member 261 also functions as a back yoke of the field magneton (the permanent magnets 262). As shown in FIG. 2, the retaining members 28 of the linear motor main bodies 22 are arranged in a zigzag shape in which the retaining members 28 of the linear motor main bodies 22 provided adjacent to each other are shifted up and down from each other. Consequently, the stators 24 and the movers 26 of the adjacent linear motor main bodies 22 are arranged closer to each other in the X direction.

Figure 7:
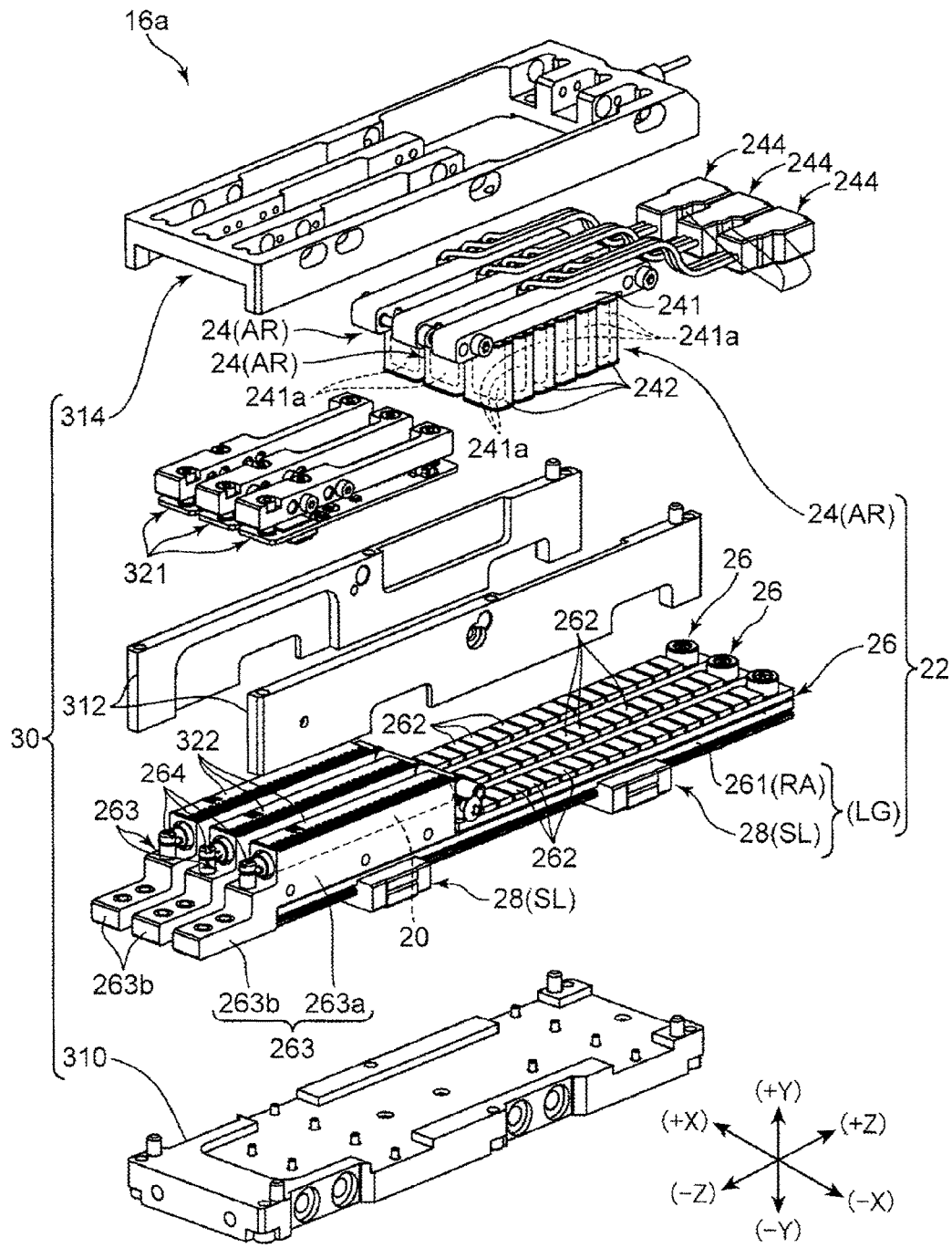
FIG. 7 is an exploded perspective view showing the configuration of the front row head.

The linear encoders 32 are encoders for detecting the positions in the Z direction of the movers 26 of the linear motor main bodies 22. The linear encoders 32 include sensor boards 321 including magnetic sensors such as MR sensors or hall sensors and plate-like magnetic scales 322 in which magnetic scales readable by the magnetic sensors are recorded. The linear encoders 32 are provided to correspond to the linear motor main bodies 22. Specifically, as shown in FIG. 7, the linear encoders 32 are fixed to the front block 314 in a state in which the three sensor boards 321 are arranged in parallel to be respectively located on the lower side (the −Z direction side) of the stators 24. Flat attachment surfaces are respectively formed on the front side of the attachment blocks 263 (the sleeve sections 263a) of the movers 26. The magnetic scales 322 are respectively fixed to the attachment surfaces. Consequently, during the driving of the linear motor, the magnetic sensors of the sensor boards 321 respectively read the magnetic scales 322 corresponding thereto, whereby the positions of the movers 26 are controlled by the not-shown control device.

The configuration of the front row head 16a located on the right side of the head unit 6 is explained above. However, the front row head 16b located on the left side includes an equivalent configuration. The rear row heads 17a and 17b include a configuration equivalent to the front row head 16a except that the number of the linear motor main bodies 22 is two. However, the front row heads 16a and 16b and the rear row heads 17a and 17b include a configuration in which the linear motor main bodies 22 of the front row heads 16a and 16b and the linear motor main bodies 22 of the rear row heads 17a and 17b are offset from each other in the X direction such that the nozzles 19 (the driving shafts 18) in the front and back are alternately arranged in a state in which the head unit 6 is viewed from the front (a state in which the head unit 6 is viewed from a +Y direction side). Consequently, the ten nozzles 19 (driving shafts 18) in total connected to the linear motor main bodies 22 are arrayed in a zigzag shape as a whole as explained above.

Figure 5:
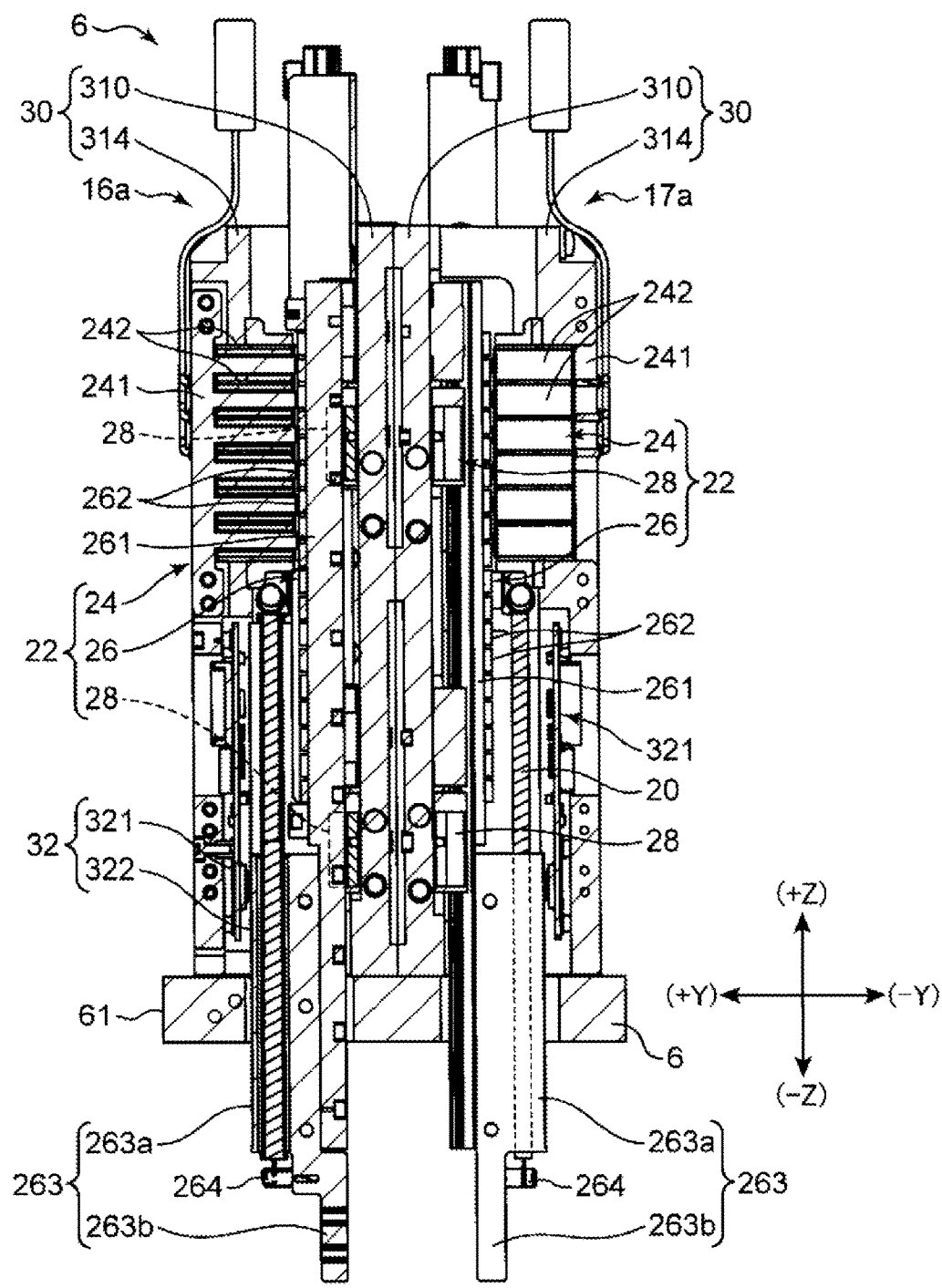
FIG. 5 is a main part enlarged view of FIG. 4 showing the configuration of a front row head and a rear row head mounted on the head unit.
Figure 6:
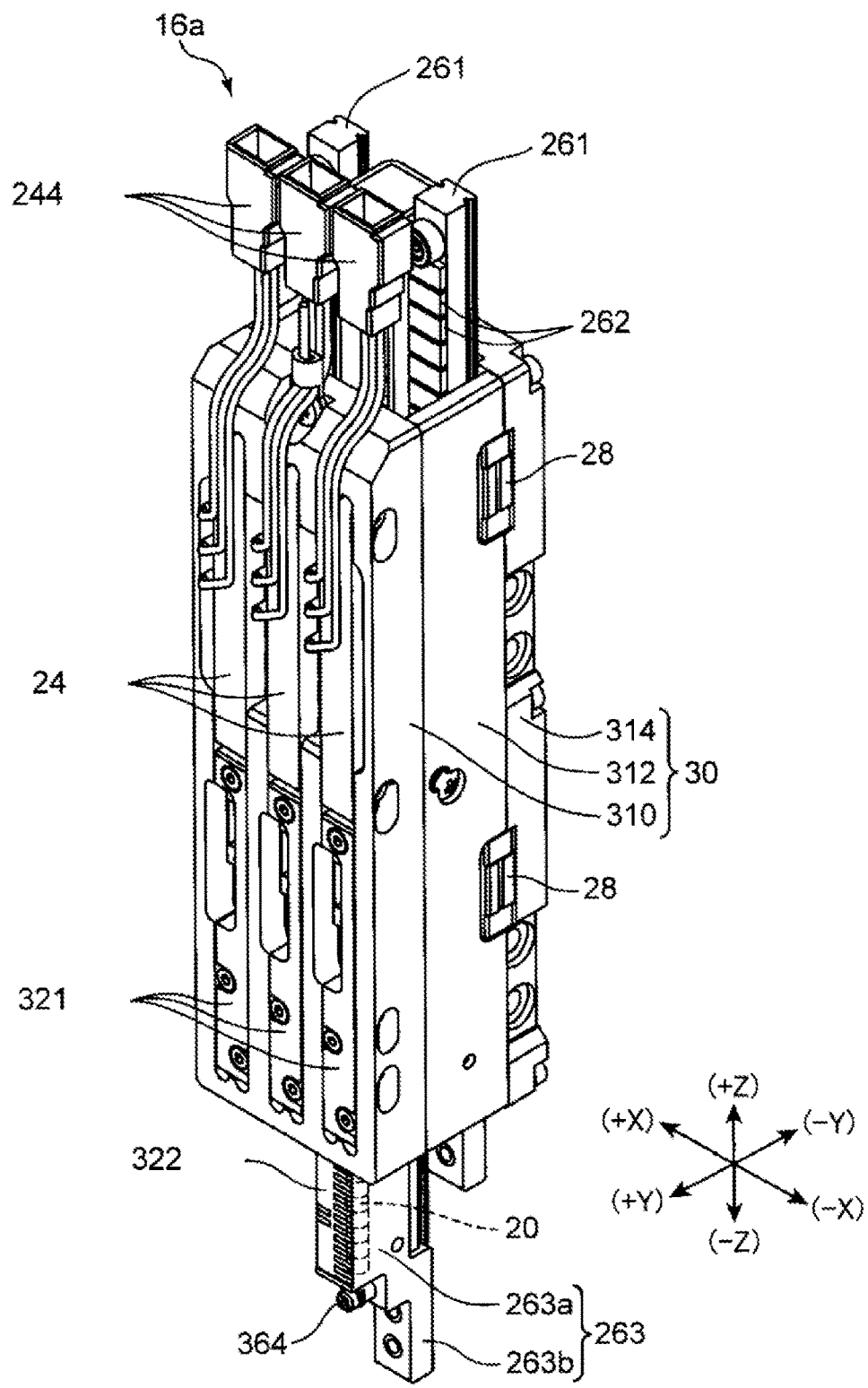
FIG. 6 is a perspective view showing the external appearance of the front row head.

As shown in FIG. 5, the front row heads 16a and 16b and the rear row heads 17a and 17b are fixed to the head frame 61 of the head unit 6 in a state in which the end blocks 310 of the frame members 30 are arranged back to back to come into contact with each other, that is, the movers 26 of the linear motor main bodies 22 are close to each other and the stators 24 are separated from each other. Note that, in this example, linear motors of a set of heads provided adjacent to each other in the X direction or the Y direction among the heads 16a to 17b are equivalent to a first linear motor and a second linear motor of the present disclosure.

The rotation driving mechanism is configured as explained below. That is, as shown in FIG. 4, the driving shafts 18 of the heads 16a to 17b are assembled to the attachment blocks 263 of the movers 26 via shaft retaining members 181 configured to retain the driving shafts 18 to be rotatable about the center axes thereof (in the R direction). Halfway portions in the longitudinal direction of the driving shafts 18 of the heads 16a to 17b are retained by a not-shown retaining section of the head frame 61 in a state in which the driving shafts 18 can move in the Z direction and rotate about the center axes (in the R direction). A driving belt is laid in predetermined order over driving pulleys attached to two R-axis servomotors 42a and 42b (shown in FIG. 3) fixed to the head frame 61 and not-shown driven pulleys attached to the driving shafts 18 by spline coupling. Consequently, the nozzles 19 (the driving shafts 18) of the heads 16a to 17b are driven to integrally rotate in each of specific groups.

In the component mounting device, mounting of a component is performed as explained below.

First, the head unit 6 moves to the component supplying sections 4 and 5 and attraction of a component by the nozzles 19 is performed. Specifically, after predetermined nozzles 19 are arranged, for example, above the tape feeders 4a, the driving shafts 18 are driven to ascend and descend by the linear motor. Consequently, the nozzles 19 descend and a component in the tape is taken out in an attracted state. In this case, if possible, attraction of the component is simultaneously performed by the plurality of nozzles 19. When the attraction of the component is completed, the head unit 6 moves onto the board 3 passing above the imaging unit 7 along a predetermined route. During the movement, the attracted state of the component by the nozzles 19 is recognized as an image, a correction amount during mounting is calculated by the not-shown control device, and the driving shafts 18 are turned by the R-axis servomotors 42a and 42b to set the direction of the attracted component to a predetermined angle. When the head unit 6 reaches an initial mounting position (a mounting position determined taking into account the correction amount) on the board 3, the driving shafts 18 are driven to ascend and descend by the linear motor and the component is mounted on the board 3. Thereafter, the head unit 6 sequentially moves to the mounting position, whereby the remaining attracted components are mounted on the board 3.

As explained above, in the component mounting apparatus, the nozzles 19 (the driving shafts 18) are driven to ascend and descend by the linear motor (the linear motor main body 22). The linear motor (the linear motor main body 22) applied to the component mounting apparatus includes the configuration explained above. Therefore, it is possible to smoothly move the nozzles 19 (the movers 26) with a compact configuration. That is, the linear motor (the linear motor main body 22) incorporated in the front row heads 16a includes a structure of a moving magnet type in which the armatures are the stators 24 as explained above. Therefore, even when the total length (the length in the Z direction) of the armatures is relatively large, unlike the related art (Japanese Patent Application Laid-open No. 2004-312983), it is unlikely that smooth movement of the movers 26 is hindered by the influence of their own weight of the movers 26, a moment and the like due to their own weight, and the like. The shaft-like member 261, to which the field magneton (the permanent magnets 262) is fixed, is directly movably supported on the frame member 30 by the retaining members 28. Therefore, the linear motor includes a structure in which the stators 24 (the armatures), the movers 26 (the permanent magnets 262 and the shaft-like members 261), and the retaining members 28 are simply arrayed in a row in an opposing direction of the stators 24 and the movers 26 (in the Y direction). Therefore, the entire linear motor (the linear motor main body 22) is compact in both of the opposing direction of the stators 24 and the movers 26 (the Y direction) and the width direction (the X direction; a direction orthogonal to both of the opposing direction of the stators 24 and the movers 26 and the moving direction of the movers 26). In particular, in the linear motor (the linear motor main body 22), the shaft-like member 261, to which the field magneton (the permanent magnets 262) is fixed, is directly movably supported on the frame member 30 by the retaining members 28. Therefore, a dimension from the surfaces (surfaces opposed to the stators) of the movers 26 to the bottom surfaces (fixed surfaces opposed to the end block 310) of the retaining members 28 is extremely small. Therefore, the entire linear motor is effectively made compact in the opposing direction of the stators 24 and the movers 26 (the Y direction). Therefore, with the component mounting device, it is possible to smoothly move the nozzles 19 (the movers 26) with the compact configuration of the linear motor (the linear motor main body 22).

In the linear motor, as explained above, the shaft-like member 261 is formed of magnetic material. Therefore, the linear motor includes a configuration in which the shaft-like member 261 also functions as the back yoke of the field magneton (the permanent magnets 262). With the configuration of the linear motor, compared with a configuration in which an exclusive back yoke is separately provided, the dimension from the surfaces (the surfaces opposed to the stators) of the movers 26 to the bottom surfaces (the fixed surfaces opposed to the end block 310) of the retaining members 28 is reduced. Therefore, there is also an advantage that the linear motor (the linear motor main body 22) is made compact in the Y direction with a reasonable configuration.

The linear motor applied to the component mounting device is the multi-axis linear motor as explained above. The linear motor has a configuration in which the three (or two) linear motor main bodies 22 respectively configured from the stators 24, the movers 26, and the retaining members 28 are integrally incorporated in a state in which the linear motor main bodies 22 are arranged in parallel on the inside of the common (one) frame member 30 having a hollow box shape. With such a configuration, compared with a configuration in which a plurality of linear motors having structures independent from one another are provided in parallel, that is, a configuration in which the linear motor main bodies 22 are completely partitioned by frames or the like, it is possible to reduce an occupied space of the frame member 30. Consequently, the entire linear motor is made compact in an arranging direction of the linear motor main bodies 22. Therefore, since the linear motor is made compact in this way, there is also an advantage that it is possible to attain a reduction in the size of the head unit 6. During manufacturing of the component mounting device, by incorporating the multi-axis linear motor assembled in a separate process in advance in the head frame 61, it is possible to easily configure the heads 16a to 17b. Therefore, there is also an advantage that assemblability of the component mounting device is improved.

Note that the component mounting device explained above is an illustration of a preferred embodiment of the component mounting device according to the present disclosure (the component mounting device applied with the linear motor according to the present disclosure). The specific configurations of the component mounting device and the linear motor can be changed as appropriate in a range not departing from the gist of the present disclosure.

For example, in the embodiment, the head unit 6 is configured to drive the nozzles 19 (the driving shafts 18) with the multi-axis linear motor having the three-axis (two-axis) configuration, that is, the linear motor in which three (two) linear motor main bodies 22 are incorporated in the common (one) frame member 30. However, naturally, the head unit 6 may be configured to drive the nozzles 19 (the driving shafts 18) with a single-axis linear motor, that is, a linear motor in which one linear motor main body 22 is incorporated in one frame member.

In the embodiment, the nozzles 19 (the driving shafts 18) of the front row heads 16a and 16b and the nozzles 19 (the driving shafts 18) of the rear row heads 17a and 17b are offset from each other in the X direction. However, naturally, the nozzles 19 in the front and back may be arranged in the Y direction in the same position in the X direction.

Since the shaft-like member 261 is formed of magnetic material, the linear motor in the embodiment includes the configuration in which the shaft-like member 261 also functions as the back yoke of the field magneton (the permanent magnets 262). However, naturally, an exclusive back yoke may be interposed between the shaft-like member 261 and the permanent magnets 262.

In the linear motor in the embodiment, the stators 24 and the retaining members 28 configured by the sliders are directly fixed and supported on the frame member 30. However, the stators 24 and the retaining members 28 may be fixed and supported on the frame member 30 via an intermediate object.

The present disclosure explained above is summarized as follows.

A linear motor according to an aspect of the present disclosure includes: a stator including an armature, the armature including a core and coils, the core including a plurality of teeth arranged in a first direction, the coils being attached respectively to the teeth of the core; a mover including a shaft-like member extending in the first direction and having an opposed surface opposed to the armature and a field magneton made of a plurality of permanent magnets arrayed along the shaft-like member such that magnetic poles of the magnets on the armature side are alternately different, the plurality of permanent magnets being fixed to the opposed surface; a frame member configured to support the stator; and a retaining member attached to the frame member and configured to retain the shaft-like member movably in the longitudinal direction thereof such that the mover is movable in the first direction with respect to the stator.

With the linear motor, since the armature is the stator, it is possible to smoothly move the mover irrespective of the size (the entire length) of the armature. Moreover, the linear motor has a structure in which the shaft-like member, to which the armature is fixed, is directly movably retained by the retaining member, and the stator (the armature), the mover (the field magneton and the shaft-like member), and the retaining member are arranged in a row in an opposing direction of the stator (the armature) and the mover (the field magneton). Therefore, it is possible to make the entire linear motor compact in both of the opposing directions of the stator and the mover and the width direction (a direction orthogonal to both of the opposing directions of the armature and the field magneton and the moving direction of the mover).

In the linear motor, it is preferable that the shaft-like member is formed of a magnetic material.

With this configuration, since the shaft-like member functions as a back yoke of the field magneton, it is possible to prevent a magnetic force leak of the field magneton (the permanent magnets) without separately providing a yoke for the field magneton. Therefore, since an exclusive yoke is unnecessary, it is possible to make the entire linear motor more compact in the opposing direction of the stator and the mover.

Note that it is preferable that the shaft-like member and the retaining member are configured by a guide device including a rail and a slider relatively movably supported along the rail, and the rail is the shaft-like member and the slider is the retaining member.

With this configuration, it is possible to inexpensively produce a linear motor capable of smoothly moving the mover using a well-known guide device such as a so-called linear guide.

In the linear motor explained above, with the stator, the mover, and the retaining member being formed as one linear motor main body, a plurality of linear motor main bodies may be arrayed in parallel in a second direction orthogonal to the first direction, and the plurality of linear motor main bodies may be incorporated in one frame member.

With this configuration, although a plurality of linear motors (linear motor main bodies) are substantially provided in parallel, compared with providing in parallel a plurality of linear motors having structures independent from one another, it is possible to reduce an occupied space of the frame member. Therefore, with this configuration, compared with providing in parallel the plurality of linear motors having the structures independent from one another, it is possible to configure the entire linear motor more compact.

On the other hand, a component mounting device according to an aspect of the present disclosure includes: a component supplying section; a component retaining member configured to take out a component supplied by the component supplying section and mount the component on a board; and any one of the linear motors explained above for driving the component retaining member to ascend and descend. The component retaining member is connected to the shaft-like member of the mover of the linear motor.

With the component mounting device, since the linear motor is a driving source of the component retaining member, it is possible to make a driving mechanism for the component retaining member compact. This is advantageous in suppressing an increase in size of the apparatus.

In the component mounting device, it is also possible that the linear motor includes a plurality of the linear motor main bodies and the linear motor main bodies are incorporated in one frame member, and the components retaining members are respectively connected to the shaft-like members of the movers of the linear motor main bodies.

In this case, it is preferable that the component mounting device includes a first linear motor and a second linear motor, each including the plurality of linear motor main bodies, and the first linear motor and the second linear motor are arranged in any one of a state in which the linear motor main bodies of the linear motors are arranged in a row as a whole and a state in which the linear motor main bodies of the linear motors are arranged in two rows as a whole.

With these configurations, although the component mounting device includes a plurality of the component retaining members driven to ascend and descend by using the linear motor as a driving source, it is possible to configure these driving mechanisms more compact. During manufacturing of the component mounting device, assemblability is improved by incorporating, in the device, the linear motor integrally including the plurality of linear motor main bodies.

INDUSTRIAL APPLICABILITY

As explained above, the present disclosure can further contribute to, concerning a linear motor, a demand for compactness while smoothly moving a mover. Therefore, the present disclosure is useful in, for example, a manufacturing field of an industrial machine that operates using the linear motor as a driving source, for example, a component mounting device.

The invention claimed is:

1. A linear motor including a frame member, a stator fixed to the frame member, and a mover provided to face the stator, the linear motor comprising:
   a linear guide including a rail made of a magnetic material and a retaining member to retain the rail;
   an armature provided to face the rail and including: a core having a plurality of teeth arranged in a longitudinal direction of the rail; and coils attached respectively to the teeth of the core, and a plurality of permanent magnets directly fixed to the rail in a state in which the plurality of permanent magnets are arrayed in the longitudinal direction of the rail such that magnetic poles of the magnets on a side of the armature are alternately different, wherein the retaining member is directly fixed to the frame member to retain the rail movable in the longitudinal direction of the rail, the stator is configured by the armature, the mover is configured by the rail and the plurality of permanent magnets; and the frame member has a surface that faces in a direction transverse to the longitudinal direction of the rail, the retaining member, the rail, the plurality of magnets and the armature are arranged in this order from the surface of the frame member in said direction, the retaining member being fixed onto the surface.

2. The linear motor according to claim 1, wherein, when the longitudinal direction of the rail is defined as a first direction, the stator, the mover, and the retaining member together form as one linear motor main body, a plurality of linear motor main bodies are arrayed in parallel in a second direction orthogonal to the first direction, and the plurality of linear motor main bodies are fixed to the frame member in common.

3. A component mounting device comprising:
a component supplying section;
a component retaining member configured to take out a component supplied by the component supplying section and mount the component on a board; and
the linear motor according to claim 1, for driving the component retaining member to ascend and descend, wherein
the component retaining member is connected to the rail of the mover of the linear motor.

4. The component mounting device according to claim 3, wherein when the longitudinal direction of the rail is defined as a first direction, the linear motor has a configuration such that the stator, the mover, and the retaining member together form as one linear motor main body, a plurality of linear motor main bodies are arrayed in parallel in a second direction orthogonal to the first direction, and the plurality of linear motor main bodies are fixed to the frame member in common, and the components retaining members are respectively connected to the rails of the movers of the linear motor main bodies.

5. The component mounting device according to claim 4, wherein,
as the linear motor, the component mounting device includes a first linear motor including the plurality of linear motor main bodies fixed to the frame member in common, and a second linear motor including the plurality of linear motor main bodies fixed to another frame member in common, and
the first linear motor and the second linear motor are arranged back to back in a state in which the frame members are set in contact with each other in a direction orthogonal to both the first direction and the second direction such that the linear motor main bodies of the linear motors are arranged in two rows.

6. The component mounting device according to claim 5, wherein the first linear motor and the second linear motor are arranged in any one of a state in which positions of linear motor main bodies of the first linear motor and positions of linear motor main bodies of the second linear motor coincide with each other in the second direction and a state in which the positions of linear motor main bodies of the first linear motor and the positions of linear motor main bodies of the second linear motor are shifted from each other in the second direction thereby arraying the linear motor main bodies of both the linear motors in a zigzag pattern.

* * * * *